United States Patent
Kawano et al.

(10) Patent No.: US 10,884,076 B2
(45) Date of Patent: Jan. 5, 2021

(54) MI MAGNETIC FIELD SENSOR

(71) Applicant: AICHI STEEL CORPORATION, Tokai (JP)

(72) Inventors: Takeshi Kawano, Tokai (JP); Hitoshi Aoyama, Tokai (JP); Michiharu Yamamoto, Tokai (JP); Hideo Arakawa, Tokai (JP)

(73) Assignee: AICHI STEEL CORPORATION, Tokai (JP)

( * ) Notice: Subject to any disclaimer, the term of this patent is extended or adjusted under 35 U.S.C. 154(b) by 158 days.

(21) Appl. No.: 15/555,768

(22) PCT Filed: Feb. 23, 2016

(86) PCT No.: PCT/JP2016/055231
§ 371 (c)(1),
(2) Date: Sep. 5, 2017

(87) PCT Pub. No.: WO2016/143504
PCT Pub. Date: Sep. 15, 2016

(65) Prior Publication Data
US 2018/0045792 A1 Feb. 15, 2018

(30) Foreign Application Priority Data
Mar. 6, 2015 (JP) .................................. 2015-045224

(51) Int. Cl.
*G01R 33/06* (2006.01)
*G01R 33/02* (2006.01)

(52) U.S. Cl.
CPC ........... *G01R 33/063* (2013.01); *G01R 33/02* (2013.01)

(58) Field of Classification Search
CPC ............................... G01R 33/063; G01R 33/02
See application file for complete search history.

(56) References Cited

U.S. PATENT DOCUMENTS

| 5,994,899 A * | 11/1999 | Mohri ..................... G01R 33/02 |
| | | 324/117 R |
| 2010/0231222 A1* | 9/2010 | Bazinet ................... G01R 33/04 |
| | | 324/345 |

FOREIGN PATENT DOCUMENTS

| JP | 2000-30921 A | 1/2000 |
| JP | 2002-277522 A | 9/2002 |

(Continued)

OTHER PUBLICATIONS

Uchiyama et al., Recent Advances of Pico-Tesla Resolution Magneto-Impedance Sensor Based on Amorphous Wire CMOS IC MI Sensor, IEEE Transactions on Magnetics, vol. 48, No. 11, 2012 (Year: 2012).*

(Continued)

*Primary Examiner* — Daniel R Miller
(74) *Attorney, Agent, or Firm* — Oblon, McClelland, Maier & Neustadt, L.L.P.

(57) ABSTRACT

An electrical pulse current is supplied to an amorphous wire from a pulse generator, an alternate current voltage whose magnitude is in response to an external magnetic field induced at both ends of a detecting coil wound around the amorphous wire is generated, a positive direct current is applied from a positive power supply by superimposing to the amorphous wire as a bias current so as to produce a bias of magnetization within the amorphous wire and the occurrence of pulse noises is restrained, so as to make it possible to perform high-sensitivity magnetic field detection.

6 Claims, 6 Drawing Sheets

(A)

(B)

(56) References Cited

FOREIGN PATENT DOCUMENTS

| JP | 2003-215220 A | 7/2003 |
|---|---|---|
| JP | 2008-134236 A | 6/2008 |

OTHER PUBLICATIONS

He et al., A Magnetic Sensor with Amorphous Wire, Sensors 2014, 14, 10644-10649, 2014 (Year: 2014).*
International Search Report dated May 24, 2016 in PCT/JP2016/055231 filed Feb. 23, 2016.
Notice of Reasons for Cancellation dated Jan. 6, 2020 in Japanese Patent No. 6460079, 20 pages (with English Translation).
Written Opposition filed Jul. 23, 2019 in Japanese Patent No. 6460079, 14 pages (with partial English Translation).
Basile Dufay, et al. "Characterization of an Optimized Off-Diagonal GMI-Based Magnetometer", IEEE Sensors Journal, Jan. 2013, vol. 13, No. 1, pp. 379-388.
Eugene Paperno, "Suppression of magnetic noise in the fundamental-mode orthogonal fluxgate", Science Direct, Sensors and Actuators A, 2004, vol. 116, pp. 405-409.
Masahiro Kawase, et al. "Magneto Impedance Sensor and Fluxgate Sensor Utilizing Magnetic Thin Film", MAGNE / Magnetics Jpn., 2019, vol. 14, No. 3, pp. 159-166.
Notice of Reasons for Cancellation dated Sep. 14, 2020 in Japanese Patent No. 6460079 (Application No. 2019-700581), 37 pages (with partial English Translation).
Opponent's Remarks filed Jul. 30, 2020 in Japanese Patent No. 6460079 (Application No. 2019-700581), 6 pages (with partial English Translation).
Lehui Ding et al., "Equivalent Magnetic Noise Limit of Low-Cost GMI Magnetometer", IEEE Sensors Journal, vol. 9, No. 2. Feb 2009.
N. A. Usov, et al., "Giant magneto-impedance effect in amorphous ferromagnetic wire with a weak helical anisotropy: Theory and experiment", Journal of Applied Physics 113, 243902, 2013.
T. Uchiyama, et al., "Noise Characterization of Coil Detection Type Magnetic Field Sensor Utilizing Pulse Excitation Amorphous Wire Magneto-Impedance Element", Journal of the Magnetics Society of Japan, vol. 34, No. 4, 2010.
L.G.C. Melo, et al., "Optimization of the magnetic noise and sensitivity of giant magnetoimpedance sensors" Journal of Applied Physics 103, 033903, 2008.

* cited by examiner (A)

(B)

(A)

(B)

MI MAGNETIC FIELD SENSOR

TECHNICAL FIELD OF THE INVENTION

The present invention relates to an MI (magneto impedance type) magnetic field sensor in which a voltage is generated in response to an external magnetic field intensity around an amorphous wire by applying an electrical pulse current or high frequency current to the amorphous wire.

PRIOR ART

As a high-sensitivity magnetic field sensor, there is an MI magnetic field sensor (magneto-impedance type magnetic field sensor) which uses an amorphous wire as a magneto-sensitive material.

Although the MI magnetic field sensor is often utilized for the measurement of a magnetic field, at a level of 50000 nT such as geomagnetism, since the MI magnetic field sensor is very compact and can perform high-sensitivity detection, an MI magnetic field sensor which has specifications with especially high sensitivity is utilized for, for example, as described in Patent Literature 1, the detection of iron-based foreign substances in food.

In recent years, expectations for detection of more microscopic foreign substances has increased, and there is a growing demand for realizing more accurate measurements on the detection of a level at which the intensity of a magnetic field to be detected is several nT (nT: $1/10^9$ of tesla) or less.

On the other hand, among the MI magnetic field sensors, in the MI magnetic field sensor which has specifications with especially high sensitivity, since random noises at a low level of several tens to several hundreds of pT (pT: $1/10^{12}$ of tesla) are produced, it is possible to sufficiently satisfy the requirement described above. However, depending on the individual characteristics of an amorphous wire to be used, pulse noises at a level similar to several to several tens of nT larger than the above-described level are arisen intermittently in some cases.

Although such noises are not, problematic for the measurement of geomagnetism at a level of 50000 nT described above, for example, in a line for inspecting foreign substances while moving an object to be inspected with a belt conveyor, as compared with magnetic field signals when microscopic foreign substances are mixed in food, the intensity levels are similar, which may cause an erroneous determination to be made.

Patent Literature 1: JP2008134236A

SUMMARY OF THE INVENTION

Therefore, in order to solve a technical problem for increasing reliability in the weak magnetic field detection and thereby make the smaller foreign substance inspection possible without erroneous detection, the present inventors have obtained technical knowledge in which it is necessary to prevent the occurrence of such pulse noises or restrain them to a level free from problems.

In order to solve the technical problem, the present inventors focused on a first technical idea of the present invention in which on an MI magnetic field sensor in which a voltage is generated in response to an external magnetic field intensity around an amorphous wire by applying an electrical pulse current or high frequency current to said amorphous wire, and a bias current is superposed to the electrical pulse current or high frequency current applied to the amorphous wire by applying a direct current to the amorphous wire, and also focused on a second technical idea of the present invention in which an unstable circumferential magnetization free state (hereinafter referred to as a free state) to be described later is avoided by applying the superposed bias current and thereby biasing the magnetization in a circumferential direction within the amorphous wire.

An MI (magneto-impedance type) magnetic field sensor on a first aspect described in claim 1 of the present invention in which a voltage is generated in response to an external magnetic field intensity around an amorphous wire by applying an electrical pulse current or high frequency current to the amorphous wire, is configured that a bias current is superposed to the electrical pulse current or high frequency current applied to the amorphous wire by applying a direct current to the amorphous wire.

The MI magnetic field sensor on a second aspect described in claim 2 of the present invention, according to the first aspect, is configured that a positive or negative direct current is applied to one electrode of the amorphous wire from a direct current source.

The MI magnetic field sensor on a third aspect described in claim 3 of the present invention, according to one of the first aspect or the second aspect, is configured that a magnetic field signal in response to the external magnetic field intensity around the amorphous wire is detected based on an alternate current voltage induced between two electrodes of the amorphous wire and is generated as a detected voltage.

The MI magnetic field sensor on a fourth aspect described in claim 4 of the present invention, according to one of the first aspect or the second aspect, is configured that a magnetic field signal in response to the external magnetic field intensity around the amorphous wire is detected based on an alternate current voltage induced between two electrodes of a detecting coil wound around the amorphous wire and is generated as a detected voltage.

On the MI magnetic field sensor of the first aspect of the present invention, having the configuration described above, a voltage is generated in response to an external magnetic field intensity around an amorphous wire by applying an electrical pulse current or high frequency current to the amorphous wire, and a bias current is superposed to the electrical pulse current or high frequency current applied to the amorphous wire by applying a direct current to the amorphous wire. As a result, the effect is attained to make it possible to perform high-sensitivity magnetic field detection by avoiding the free state where the current applied to the amorphous wire is zero, thereby restrain the occurrence of the pulse noises and practically making the influence of the pulse noises substantially equivalent to zero.

On the MI magnetic field sensor of the second aspect of the present invention, having the configuration described above, according to the first aspect of the present invention, the positive or negative direct current is applied to the one electrode of the amorphous wire from the direct current source. Therefore, by superposing, via one electrode, the positive or negative direct current to the electrical pulse current or high frequency current applied to the amorphous wire, with respect to the amorphous wire, the effect is attained to make it possible to perform high-sensitivity magnetic field detection by avoiding the free state where the current applied to the amorphous wire is zero, thereby restraining the occurrence of the pulse noises and practically making the influence of the pulse noises substantially equivalent to zero.

On the NI magnetic field sensor of the third aspect of the present invention, having the configuration described above, according to one of the first aspect or the second aspect of the present invention, the magnetic field signal in response to the external magnetic field intensity around the amorphous wire is detected based on the alternate current voltage induced between two electrodes of the amorphous wire and is generated as the detected voltage. Therefore, by exchanging it into the magnetic field signal corresponding to the amplitude of the detected voltage, the effect is attained to make it possible to perform high-sensitivity magnetic field detection thereby restraining the occurrence of the pulse noises and practically making the influence of the pulse noises substantially equivalent to zero.

On the MI magnetic field sensor of the fourth aspect of the present invention, having the configuration described above, according to one of the first aspect or the second aspect of the present invention, the magnetic field signal in response to the external magnetic field intensity around the amorphous wire is detected based on the alternate current voltage induced between two electrodes of the detecting coil wound around the amorphous wire and is generated as a detected voltage. As the result, by converting it into the magnetic field signal voltage corresponding to the amplitude of the detected voltage, the effect is attained to make it possible to perform higher-sensitivity (than the third aspect) magnetic field detection thereby restraining the occurrence of pulse noises and practically making the influence of the pulse noises substantially equivalent to zero.

DESCRIPTION OF THE PREFERRED EMBODIMENTS

Hereinafter, a best mode of the present invention will be described based on embodiments and examples with reference to the drawings.

EMBODIMENTS

Figure 1:
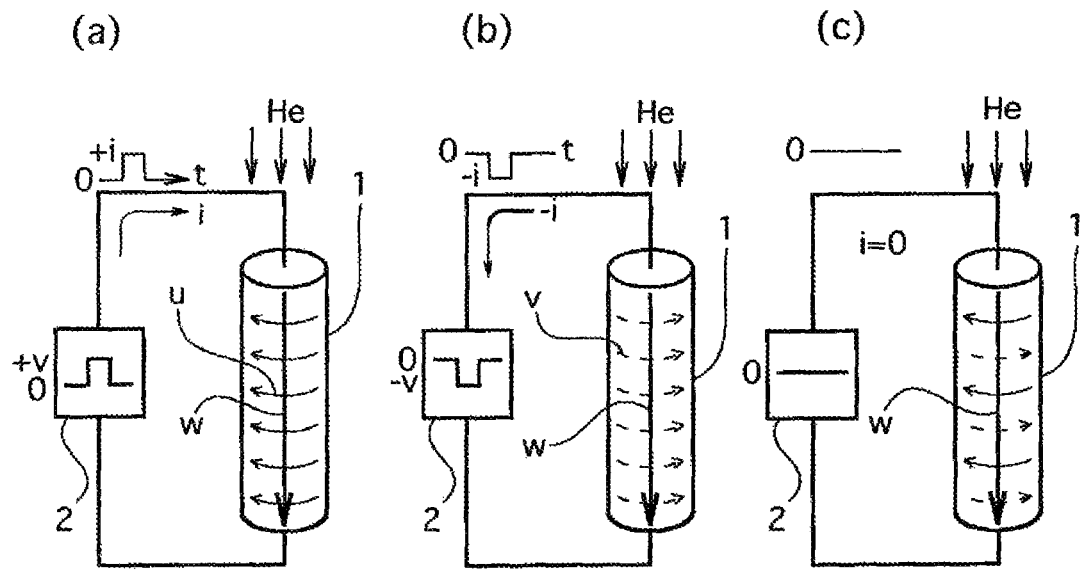
FIG. 1 is an illustrative diagram for illustrating the state of magnetization in a circumferential direction within an amorphous wire when in an MI magnetic field sensor of an embodiment of the present invention, when a positive or negative electrical pulse current is applied to the amorphous wire or when the current is not applied.

As shown in FIGS. 1(a) to 1(c), in an MI magnetic field sensor of the present embodiment, an electrical pulse current or high frequency current is applied to an amorphous wire 1 so as to bring about the MI effect by the amorphous wire 1, signal processing is performed on an alternate current voltage signal generated in response to the resulting external magnetic field, that is, a magnetic field around the amorphous wire and it is detected as a magnetic field or a magnetic field signal voltage.

That is, in the MI magnetic field sensor, for example, as shown in FIG. 1(a), when a positive electrical pulse current or high frequency current i is supplied to the amorphous wire 1 by a current source 2, magnetization u is induced in a circumferential direction within the amorphous wire 1 according to Ampere's right-handed screw rule, and an alternate current voltage signal in response to the magnitude of magnetization w within the amorphous wire 1 magnetized by the external magnetic field He is induced by the resulting MI effect. Since this alternate current voltage signal includes magnetic field information on the external magnetic field He, magnetic field detection can be performed.

On the other hand, as shown in FIG. 1(b), when a negative electrical pulse current or high frequency current −i is supplied to the amorphous wire 1, although magnetization v is induced in the circumferential direction within the amorphous wire 1 according to the Ampere's right-handed screw rule, the direction thereof is only reversed with respect to the magnetization u in the circumferential direction, and the process of the magnetic field detection induced by the resulting MI effect is the same as shown in FIG. 1(a) described above.

Furthermore, as shown in FIG. 1(c), when the electrical pulse current or high frequency current from the current source 2 is not applied so as to be zero, since nothing enforces the magnetization in the circumferential direction, the magnetization u and the magnetization v are therefore considered to be equal in the amount, and in principle, the magnetization is not magnetized to either of the directions, and the free state is achieved.

In the present embodiment, a direct bias current is supplied by superimposing to the electrical pulse current or high frequency current applied (driven) to the amorphous wire 1 so as to bias the magnetization in the circumferential direction within the amorphous wire 1, thus the free state described above is avoided and the occurrence of pulse noises is restrained, and it is experimentally confirmed that it is possible to practically make it equivalent to substantially zero.

In the experimental confirmation in the present embodiment, it can also be considered such that, in a case where the current applied to the amorphous wire is released and the current applied is zero, the magnetization u and the magnetization v in the circumferential direction of the amorphous wire are equal in the amount, and an unstable free state where the magnetization is not biased in either of the directions is considered to be present, however, due to changes in the temperature and stress, etc., a portion in which the magnetization u and the magnetization v are not equal in the amount is considered to be produced partially and instantaneously in part of the amorphous wire and therefore pulse noises occurred. That is, it can also be considered as the cause that, although in principle, the directions of the magnetization u and the magnetization v in the circumferential direction are changed according to the direction of the current applied to the amorphous wire, a state where the direction of the magnetization is not changed or returned partially is sometimes and partially occurred randomly.

First Embodiment

Figure 2:
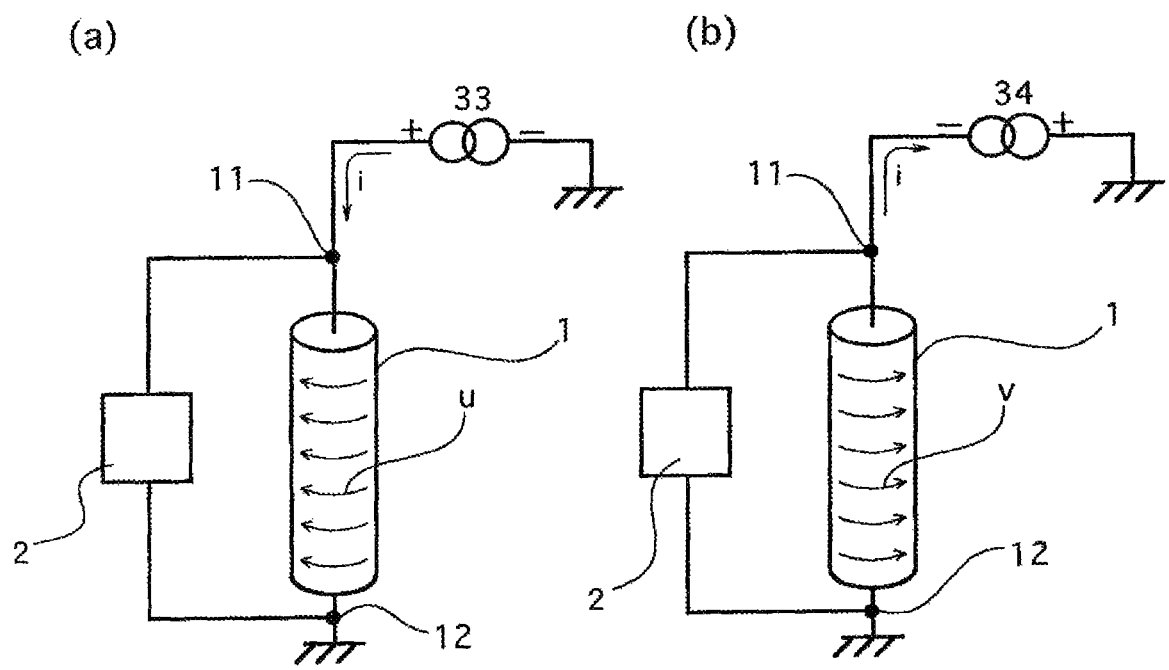
FIG. 2 is a main portion block circuit diagram showing a main portion of an example where in an MI magnetic field sensor of a first embodiment of the present invention, a positive or negative direct current is applied to one electrode of the amorphous wire.
Figure 3:
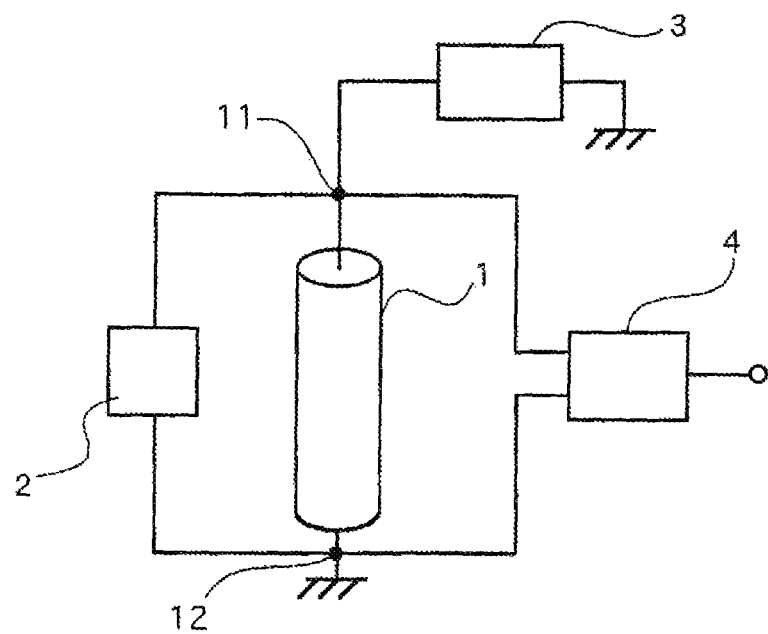
FIG. 3 is a main portion block diagram showing a main portion which performs signal processing based on an alternate current voltage in response to an external magnetic field intensity in an MI magnetic field sensor of a second embodiment of the present invention.

In the MI magnetic field sensor of a first embodiment, as shown in FIGS. 2(a) and 2(b) an oscillator means 2 which generates the pulse or high frequency current is connected to electrodes 11 and 12 of the amorphous wire 1, a current source 33 or 34 which supplies a positive (shown in FIG. 2(a)) or negative (shown in FIG. 2(b)) direct current in response to a direct current source means 3 shown in FIG. 3 is connected thereto, and thus a direct current is supplied to the amorphous wire 1, and the bias u (shown in FIG. 2(a)) or the bias v (shown in FIG. 2(b)) of the magnetization is thereby induced in the circumferential direction within the amorphous wire 1 according to the right-handed screw rule. Then, in either case, actions and effects of restraining the occurrence of pulse noises is obtained.

Second Embodiment

In the MI magnetic field sensor of a second embodiment, according to the first embodiment, as shown in FIG. 3, both ends of the amorphous wire 1 at which the alternate current voltage signal is induced by the MI effect, that is, the electrode 11 on one side and the electrode 12 on the other side are connected to the two input ends of a signal processing means 4.

In the MI magnetic field sensor of the second embodiment, the MI effect is induced about by the pulse or high frequency current applied from the oscillator means 2, a direct current is supplied to the amorphous wire 1 so as to produce a bias in the magnetization in the circumferential direction within the amorphous wire 1 according to the right-handed screw rule, and thus the occurrence of pulse noises is restrained in an alternate current voltage signal in response to the external magnetic field induced between the electrodes at both ends of the amorphous wire, with the result that actions and effects of making it possible to accurately measure fluctuations in the magnetic field which is at a level of several nT such as the detection of microscopic foreign substances is obtained.

Third Embodiment

Figure 4:
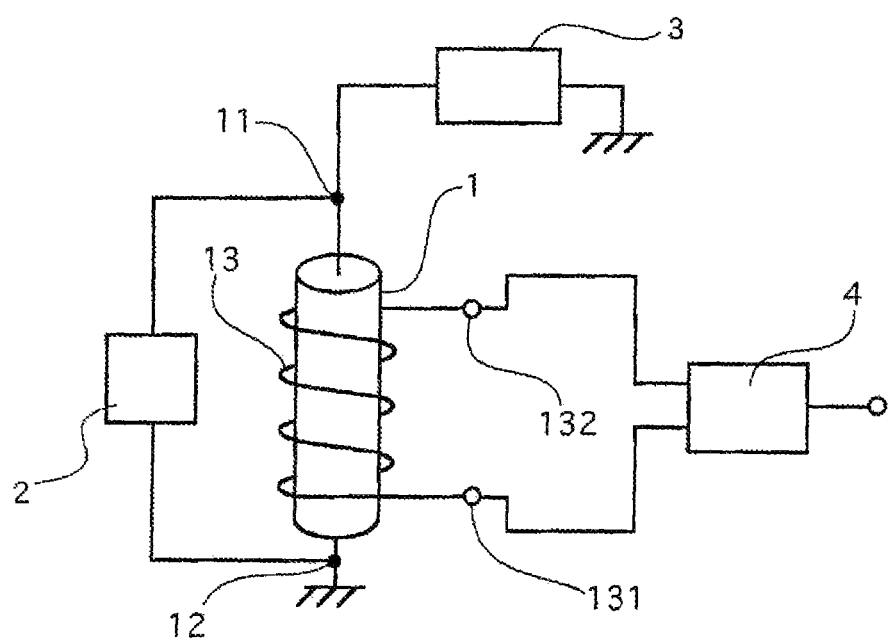
FIG. 4 is a main portion block diagram showing a main portion which performs signal processing based on an alternate current voltage generated from a detection coil wound around an amorphous wire in an MI magnetic field sensor of a third embodiment of the present invention.

In the MI magnetic field sensor of a third embodiment, according to the first embodiment, as shown in FIG. 4, a detecting coil 13 is wound around the amorphous wire 1, and both ends of the detecting coil 13, that is, an electrode 131 on one side and an electrode 132 on the other side are connected to the two input ends of the signal processing means 4, respectively.

In the MI magnetic field sensor of the third embodiment, in the configuration described above, the MI effect is induced by the pulse or high frequency current applied from the oscillator means 2, a direct current is supplied to the amorphous wire 1 so as to induce a bias in the magnetization in the circumferential direction within the amorphous wire 1 according to the right-handed screw rule, and thus the occurrence of pulse noises is restrained in an alternate current voltage signal induced by the MI effect between the two electrodes of the detecting coil, with the result that actions and effects of making it possible to accurately measure fluctuations in the magnetic field which is at a level of several nT such as the detection of weak foreign substances is obtained.

First Example

Figure 5:
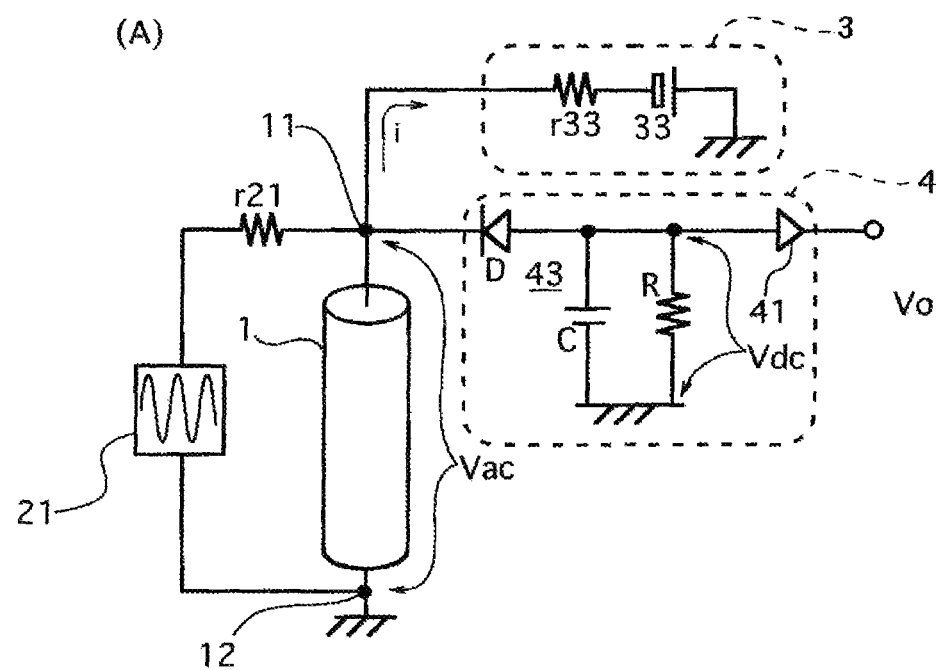
FIG. 5 is a detailed circuit diagram showing the details of an MI magnetic field sensor of a first example of the present invention and a diagram showing that the amplitude of an alternate current voltage induced between two electrodes of an amorphous wire is in response to an external magnetic field intensity.
Figure 5:
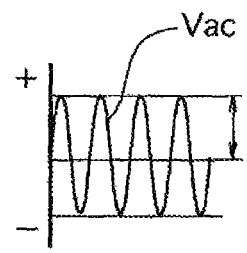

The MI magnetic field sensor of a first example is based on the first and second embodiments, and includes a sine wave oscillator 21 which applies a sine wave to the amorphous wire 1 as shown in FIG. 5(A), the direct current power supply means 3 which applies a direct current serving as a superimposing current to the amorphous wire 1, the amorphous wire 1 to which the sine wave is applied from the sine wave oscillator 21 so as to induce the MI effect, and the signal processing means 4 which performs signal processing on the alternate current voltage signal generated by the MI effect between the two electrodes of the amorphous wire 1.

The amorphous wire 1 is made of a FeCoSiB-based alloy, and is configured so as to generate the alternate current voltage signal Vac having an amplitude in response to the external magnetic field around the amorphous wire from the electrodes 11 and 12 at both ends based on the applying of the sine wave by the sine, wave oscillator 21 by the MI (magneto-impedance) effect as shown in FIG. 5(B).

The oscillator means 2 which applies the electrical pulse current or high frequency current for inducing the MI effect on the amorphous wire is configured by the sine wave oscillator 21 which generates a sine wave current, and is configured so as to supply the sine wave to the amorphous wire 1 via a current adjustment resistor r21 which is connected to the electrode 11 at one end of the amorphous wire 1 as shown in FIG. 5(A) and is used to adjust the current applied to the amorphous wire 1.

The direct current power supply means 3 includes the negative power supply 33 whose positive pole is grounded as shown in FIG. 5(A), and a resistor r33 in which one end is connected to the electrode 11 at one end of the amorphous wire 1 and the other end is connected to the negative pole of the negative power supply 33 and which is used to adjust the current when a negative current is supplied to the amorphous wire 1, and is configured so as to apply the negative direct current of a predetermined level to the electrode 11 at the one end of the amorphous wire 1.

As shown in FIG. 5(A), the signal processing means 4 is configured by a detection circuit 43 that is formed with a diode D whose cathode is connected to the electrode 11 at one end of the amorphous wire 1, a capacitor C in which one end is connected to the anode of the diode D and the other end is grounded, and a resistor R in which one end is connected to the anode of the diode D and the other end is grounded, and is a circuit which converts the alternate current voltage signal of a sine wave generated by the amorphous wire 1 into a voltage in response to its amplitude.

Between the electrodes 11 and 12 at both ends of the amorphous wire 1, as shown in FIG. 5(B), the alternate current voltage signal Vac of the sine wave whose amplitude is in response to the external magnetic field where the amorphous wire 1 is placed is generated, and is converted into a magnetic field signal voltage Vdc in response to the amplitude of the alternate current voltage signal Vac.

Then, an amplifier 41 is provided which amplifies a direct current voltage at both ends of the resistor R converted by the detection circuit 43 at a predetermined magnification so as to generate a voltage Vo in response to the external magnetic field.

In the MI magnetic field sensor of the first example of the configuration described above, the sine wave is applied to the amorphous wire 1 by the sine wave oscillator 21 forming the oscillator means 2 via the resistor r21, and the negative direct current is applied to the electrodes 11 and 12 of the amorphous wire 1 by the negative power supply 33 forming the direct current power supply means 3 via the resistor r33.

Since the sine wave is applied to the amorphous wire 1 by the sine wave oscillator 21, the MI effect is induced, and between both poles 11 and 12, as shown in. FIG. 5(B), the alternate current voltage signal Vac of the sine wave whose amplitude is in response to the external magnetic field around the amorphous wire 1 is generated.

In the signal processing means 4, by the detection circuit 43 configured by the diode D connected to the electrode 12 of the amorphous wire 1, the capacitor C, and the resistor R, between the electrodes 11 and 12 of the amorphous wire 1, as shown in FIG. 5(B), the alternate current voltage signal Vac in response to the external magnetic field is generated and is converted into the magnetic field signal voltage Vdc in response to the amplitude of the alternate current voltage signal Vac, and the voltage Vdc obtained by the conversion is amplified by the amplifier 41 to the predetermined magnification, and is generated as the voltage Vo in response to the external magnetic field.

The MI magnetic field sensor of the first example has the effect of applying, as described above, the negative direct current to the amorphous wire 1 from the negative power supply 33 so as to bias the magnetization within the amorphous wire, thereby restraining the occurrence of pulse noises which make it difficult to perform high-sensitivity magnetic field detection, and make it possible to perform high-sensitivity magnetic field detection substantially free from pulse noises.

The MI magnetic field sensor of the first example also has operations and effects of restraining the occurrence of pulse noises and thereby making it possible to perform weak magnetic field detection at a level equal to or more than random noises and equal to or less than the pulse noises.

Second Example

Figure 6:
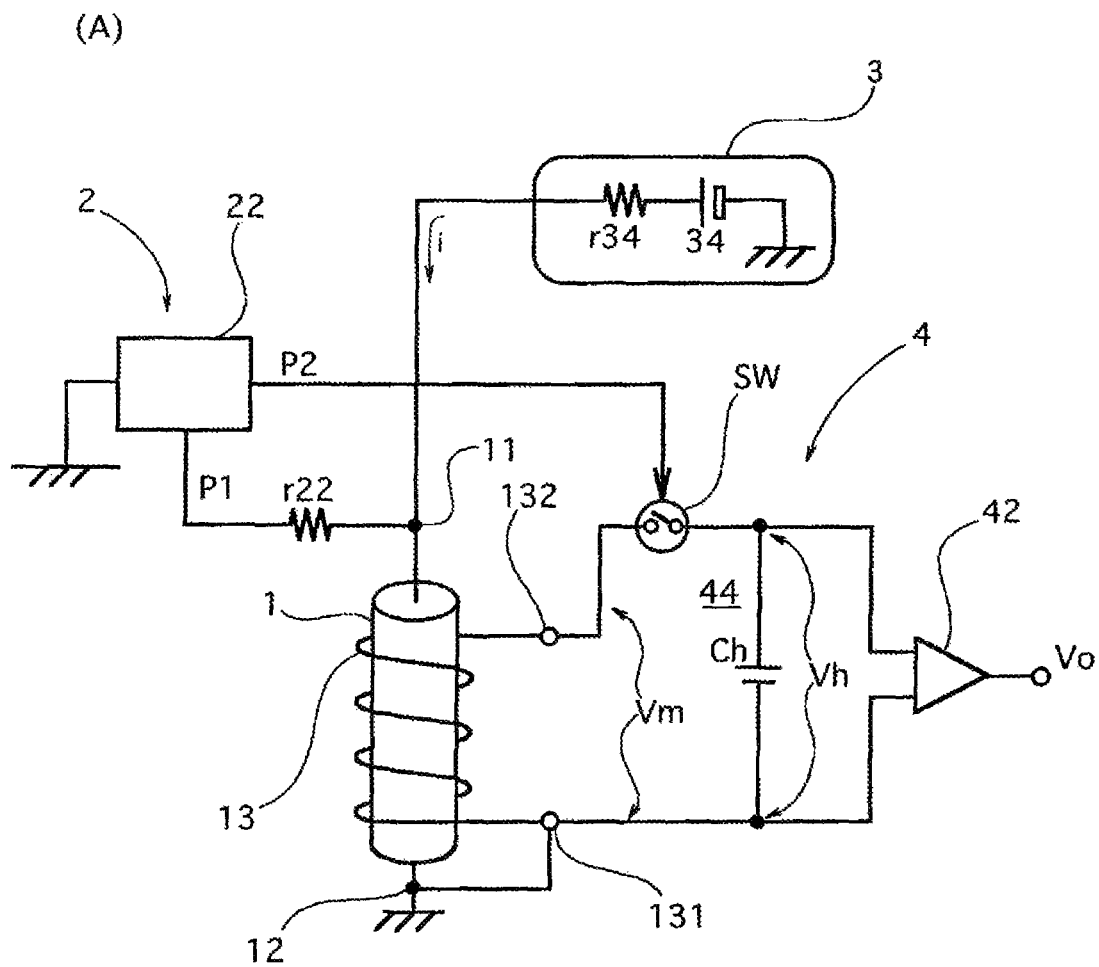
FIG. 6 is a detailed circuit diagram showing the details of an MI magnetic field sensor of a second example of the present invention and a diagram showing an electrical pulse current applied to an amorphous wire, an alternate current voltage detected by a detecting coil and a pulse for turning on a switch of a sample-hold circuit.
Figure 6:
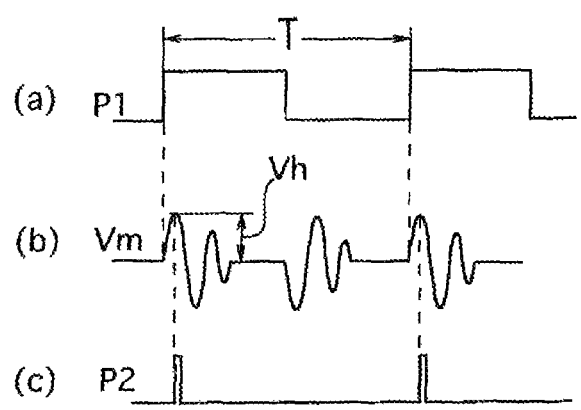

The MI magnetic field sensor of the second example is based on the first and third embodiments described above, differs from the first example in that the alternate current voltage induced by the MI effect of the amorphous wire is detected by the detecting coil 13 wound around the amorphous wire, and includes the amorphous wire 1 which brings about the MI (magneto-impedance) effect between the electrodes 11 and 12 at both ends as shown in FIG. 6(A) and includes the detecting coil 13, a pulse oscillator 22 which applies an electrical pulse current to the amorphous wire 1, the direct current power supply means 3 which applies, as a superimposing current, a positive direct current to the amorphous wire 1, and the signal processing means 4 which performs signal processing on the alternate current voltage signal generated by the MI effect between the electrodes 131 and 132 at both ends of the detecting coil 13.

The amorphous wire 1 is made of a FeCoSiB-based alloy, and, as shown in FIG. 6(B), is configured so as to generate the alternate current voltage signal Vac having an amplitude in response to the external magnetic field around the amorphous wire induced by the MI effect from the electrodes 131 and 132 at both ends of the detecting coil 13 wound around the amorphous wire 1.

The oscillator means 2 which applies the electrical pulse current for bringing about the MI effect on the amorphous wire is configured by the pulse generator 22 which generates electrical pulse currents P1 and P2, and is configured so as to apply the electrical pulse current to the amorphous wire 1 via a current adjustment resistor r22 which is connected to the other end of the amorphous wire 1 as shown in FIG. 6(A) and is used to adjust the current applied to the amorphous wire 1. The electrical pulse currents P1 and P2 are brought into an on state with a predetermined voltage for a predetermined time as shown in (a) and (b) of FIG. 6(B), a certain difference is provided between rising times and a predetermined repeating time T is set.

The direct current power supply means 3 includes the positive power supply 34 whose negative pole is grounded as shown in FIG. 6(A), and a resistor r34 in which one end is connected to the other end 11 of the amorphous wire 1 and the other end is connected to the positive pole of the positive power supply 34 and which supplies a positive current, and is configured so as to apply a positive direct current of a predetermined level to the amorphous wire 1.

The signal processing means 4 is configured by a sample-hold circuit 44 that is formed with an analog switch SW whose one end is connected to one end 132 of the detecting coil wound around the amorphous wire 1 as shown in FIG. 6(A), and a hold capacitor Ch in which one end is connected to the other end of the analog switch SW and the other end is grounded, and is a circuit for converting an alternate current voltage signal Vm generated by the detecting coil 13 and repeated at the predetermined time T into a voltage in response to its amplitude. Between both electrodes 131 and 132 at both ends of the detecting coil 13, as shown in (b) of FIG. 6(B), the alternate current voltage, signal Vm of a sine wave whose amplitude is in response to the external magnetic field where the amorphous wire 1 is placed is generated and is converted into a magnetic field signal voltage Vh in response to the amplitude of the alternate current voltage signal Vm which is sample-held. A high input impedance amplifier 42 is provided which amplifies a direct current voltage converted by the sample-hold circuit 44 at a predetermined magnification so as to generate it as a voltage Vo in response to the external magnetic field.

In the MI magnetic field sensor of the second example of the configuration described above, the electrical pulse current P1 shown in (a) of FIG. 6(B) is applied to the amorphous wire 1 by the pulse oscillator 22 forming the oscillator means 2 via the resistor r22, and the current is applied to the electrode 11 of the amorphous wire 1 by the positive power supply 34 forming the direct current power supply means 3 via the resistor r34.

Since the electrical pulse current is applied to the amorphous wire 1 via the electrode 11 by the pulse oscillator 22, the MI effect is brought about, and between both poles 131 and 132 of the detection coil 13, as shown in FIG. 6(B), there is generated as the alternate current voltage, signal Vm which is repeated at the predetermined time T whose amplitude is in response to the external magnetic field around the amorphous wire 1.

A positive current source circuit serving as the direct current source means 3 includes the resistor r34 and the positive power supply 34 is connected to the electrodes 11 and 12 of the amorphous wire so as to supply a positive direct current i to the amorphous wire 1, thus the bias u of the magnetization is generated in the circumferential direction within the amorphous wire 1 and consequently, the occurrence of pulse noises which make it difficult to detect a weak magnetic field is restrained, with the result that highly accurate magnetic field detection can be performed.

Furthermore, the amorphous wire 1 is connected to one output terminal of the pulse generator 22 which serves as the oscillator means 2 and has two output terminals via the electrode 11 on one side, and the electrical pulse current P1 of a predetermined voltage, a predetermined ON-time and the predetermined repeating time T is applied via the resistor r22, and the MI effect is thereby repeated at the period of the repeating time T.

That is, between the two electrodes 131 and 132 of the detecting coil 13 wound around the amorphous wire 1, an alternate current voltage Vm is induced by the MI effect repeating at the predetermined time T. The alternate current voltage Vm is a damped oscillation, and the amplitude thereof is in response to the external magnetic field where the amorphous wire 1 is placed.

Although the damped oscillation by the MI effect is generated, as shown in (b) of FIG. 6(B), at the rising time and the falling time of the pulse P1, in the second example, an example where signal processing is performed based on the damped oscillation at the rising time is described as an example.

In the signal processing means 4, the other output terminal of the pulse generator 22 is connected to the control terminal of the analog switch SW, as shown in FIG. 6(B), only while the pulse P2 is on, the analog switch SW is "closed," that is, is brought into a conduction state, and thus the alternate current voltage Vm which is the damped oscillation appearing between both electrodes 131 and 132 of the detecting coil 13 is supplied to the hold capacitor Ch only while the analog switch SW is "closed."

Then, since the time in which the pulse P2 is kept in an on state in response to the pulse width is significantly short as compared with the cycle (the reciprocal of the frequency) of the alternate current voltage Vm, the instantaneous value of the alternate current voltage Vm, for example, a peak voltage is sample-held as a voltage in the sample-hold capacitor Ch. The pulses P1 and P2 are synchronized with a certain phase difference, and thus the alternate current voltage repeating at the predetermined time T is sample-held with predetermined timing each time.

Since the amplitude of the alternate current voltage Vm is, as described previously, in response to the intensity of the external magnetic field where the amorphous wire 1 is placed, an instantaneous value Vh of the alternate current voltage Vm sample-held here is also in response to the intensity of the external magnetic field.

Then, the amplifier 42 amplifies the sample-held voltage Vh at the predetermined amplification so as to generate it as the magnetic field signal voltage Vo.

Since as described previously, the direct current is applied to the amorphous wire 1, the MI magnetic field sensor of the second example has actions and effects of generating the bias of the magnetization within the amorphous wire 1 so as to restrain the occurrence of pulse noises which make it difficult to accurately measure fluctuations in a weak magnetic field and thereby make it possible to detect a magnetic field substantially free from pulse noises.

Furthermore, the results of an experiment which was performed for confirming the effect of restraining the occurrence of noises by the bias of the magnetization in the MI magnetic field sensor of the second example will be described below.

In this experiment, the MI magnetic field sensor was placed within a triple-shielded box made of permalloy so that the results of the experiment would not be affected by geomagnetic components or magnetic field components other than geomagnetism entering from the outside, and then the experiment was performed. In this way, it is possible to set the output of the magnetic field sensor caused by an external magnetic field almost exactly to zero. The diameter of the amorphous wire of the MI magnetic field sensor used was 10 μm, and the length thereof was 1 mm. The results thereof will be described below.

Figure 7:
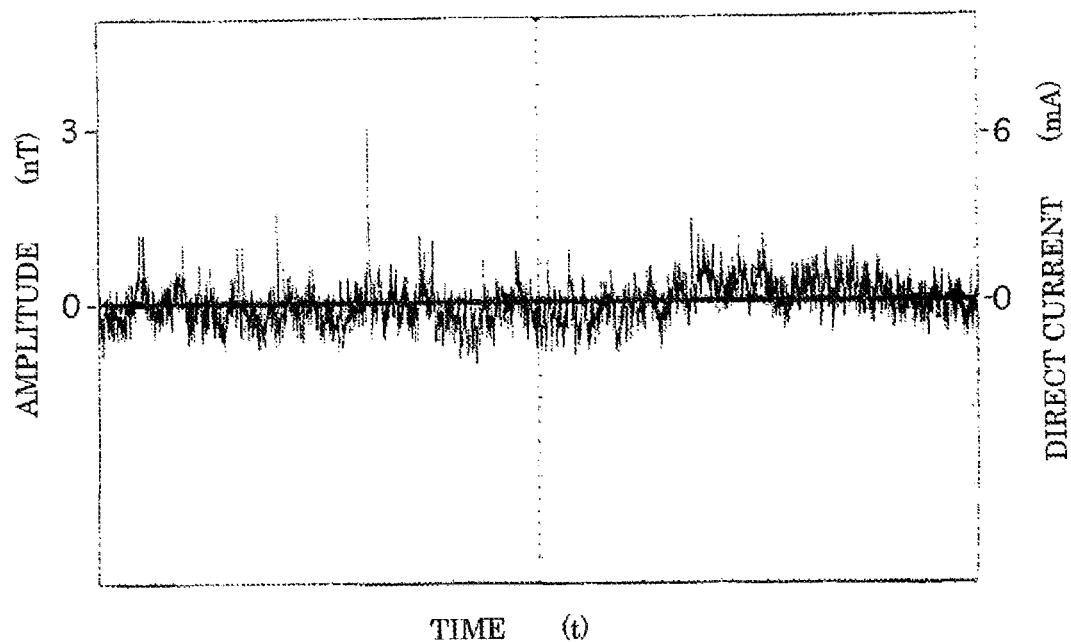
FIG. 7 is a diagram showing pulse noises caused by a free state of an amorphous wire in a comparative example.
Figure 8:
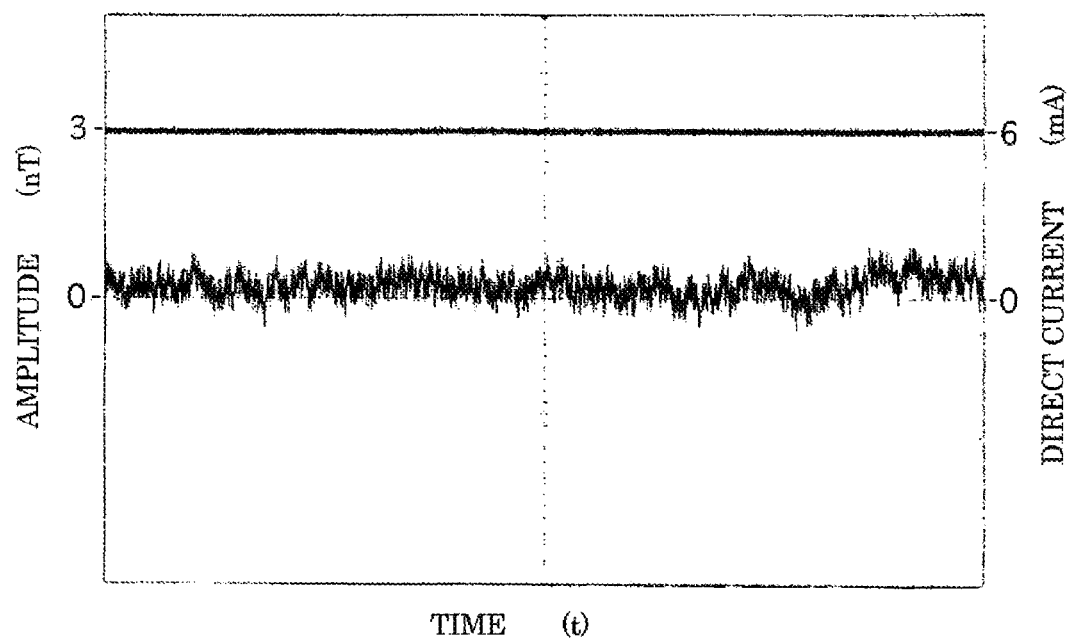
FIG. 8 is a diagram showing results obtained by confirming the effect of restraining pulse noises by superimposing a direct current in the second example.

In a case of a comparative example where a direct current was not applied so as to be zero, as shown in FIG. 7 in which the vertical axis represents the amplitude (nT) of a pulse noise and the horizontal axis represents time (t), the occurrence of a pulse noise was observed a plurality of times, and the occurrence of a pulse noise equivalent to the output of 3 nT at maximum was observed. As described above, this experiment was performed on condition that the influence of an external magnetic field was completely eliminated, and thus this pulse noise was generated although a magnetic field of 3 nT does not actually occur. The existence of such an output becomes a major cause for lowering the accuracy. However, when a direct current of 6 mA was applied to the amorphous wire 11, as shown in FIG. 8 in which the vertical axis represents the amplitude (nT) of a pulse noise and the horizontal axis represents time (t) so as to have the same scale as in FIG. 7, it was confirmed that pulse noises in the comparative example were removed and only random noises equivalent to several hundred pT, that is, ±0.5 nT were substantially generated. The vertical axes of FIGS. 7 and 8 were drawn so as to have the same scale. In FIGS. 7 and 8, a transition in the value of the direct current was also described.

Figure 9:
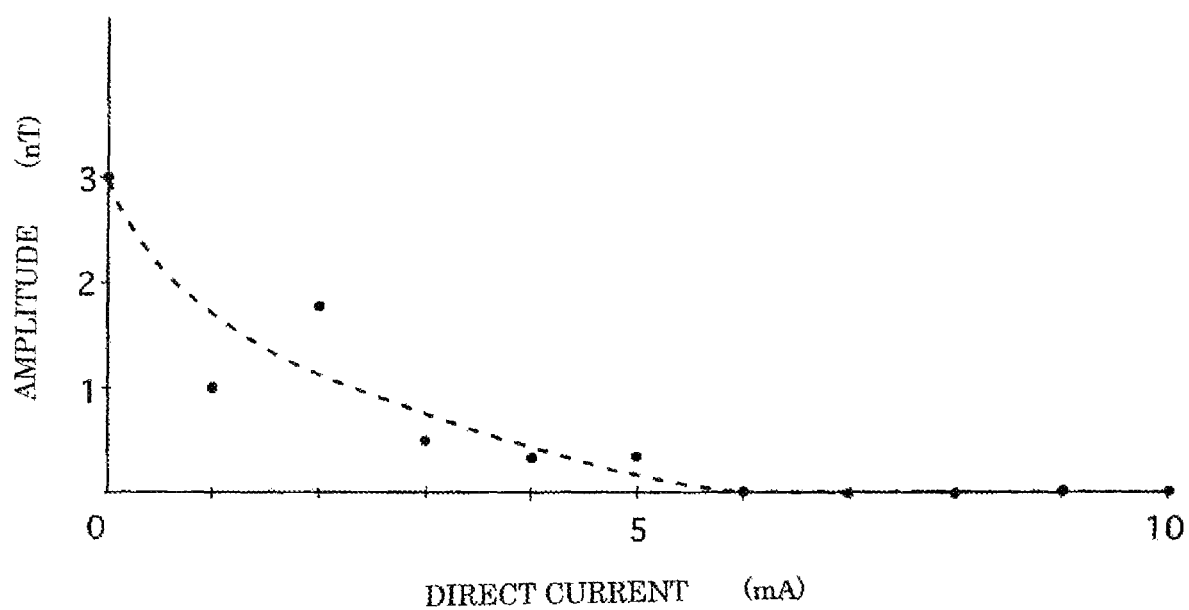
FIG. 9 is a diagram showing a relationship between the direct current and the magnitude of the pulse noises in the second example.

FIG. 9 is a diagram showing a relationship between a direct current which was applied as a superimposing current for an electrical pulse current applied to the amorphous wire 1 and the maximum amplitude of a pulse noise obtained by changing and controlling the direct current, the vertical axis represents the amplitude of the pulse noise and the horizontal axis represents the direct current. It was confirmed that as is clear from FIG. 9, under conditions of the second example, when the direct current was up to 5 mA, the amplitude of the pulse noise was lowered along an approximate parabola whereas when the direct current was 6 mA or more, the magnitude of the pulse noise converges almost exactly to zero. However, since the absolute value of the direct current capable of restraining a pulse noise is considered to change depending on the specifications of the amorphous wire 1 and the detecting coil 13, etc., it is considered that settings may be made such that the direct current of an appropriate magnitude is superimposed.

Therefore, the MI magnetic field sensor of the second example has actions and effects of making it possible to restrain the occurrence of pulse noises equivalent to several nT so as to significantly enhance the accuracy of a measurement when a magnetic field at a level equal to or less than serval nT is detected.

As described above, in the MI magnetic field sensor of the second example, when the electrical pulse current is applied to the amorphous wire 1 by the pulse generator 22, the direct current of an appropriate magnitude is superimposed, and thus it is possible to restrain pulse noises, and therefore the MI magnetic field sensor has the effect of making it possible to detect an output which is equal to or more than random noises and equal to or less than pulse noises before being restrained without erroneous detection.

The preferred embodiments of the present invention, as herein disclosed, are taken as some embodiments for explaining the present invention. It is to be understood that the present invention should not be restricted by these embodiments and any modifications and additions are possible so far as they are not beyond the technical idea or principle based on descriptions of the scope of the patent claims.

INDUSTRIAL APPLICABILITY

Although the present invention can naturally be utilized for the measurement of a relatively large magnetic field such as geomagnetism, the present invention can be effectively utilized in a case where it is applied to applications where, in particular, changes in a weak magnetic field at a level of nT must be detected without omission, including, the magnetic detection by research devices such as magnetic activity, earthquake prediction and solar radiation, highly accurate magnetic field measuring devices in physical and chemical research, highly accurate magnetic field detection by a magnetic failure measurement device, etc., detection of foreign substances in food, the reading of a magnetic pattern in a security gate and a magnetic card, etc., and the inspection of a magnetic pattern in a bank note, etc.

DESCRIPTION OF SYMBOLS

1 amorphous wire
2 oscillator means
4 signal processing means
13 detecting coil
22 pulse generator
34 positive power supply
42 amplifier
44 sample-hold circuit

What is claimed is:

1. An MI (magneto-impedance) magnetic field sensor in which a voltage is generated in response to an external magnetic field intensity around an amorphous wire by applying an electrical pulse current from a pulse current source connected via a current adjustment resistor for adjusting the current applied to the amorphous wire, wherein
the MI magnetic field sensor is configured such that a direct current, which allows for restraining of intermittent occurrence of pulse noise at nano Tesla level depending on individual characteristics of the amorphous wire, is applied to the amorphous wire from a direct current source connected to the amorphous wire and in parallel to the pulse current source, and a bias current is superposed to the electrical pulse current applied to the amorphous wire by applying the direct current to the amorphous wire so as to avoid a state where the current applied to the amorphous wire is zero, in order to avoid a free state where nothing enforces the magnetization in a circumferential direction within the amorphous wire.

2. The MI magnetic-field sensor according to claim 1, wherein
the MI magnetic field sensor is configured such that a positive or negative direct current is applied to one electrode of the amorphous wire from the direct current source.

3. The MI magnetic field sensor according to claim 1, wherein
the MI magnetic field sensor is configured such that a magnetic field signal in response to the external magnetic field intensity around the amorphous wire is detected based on an alternating current voltage induced between two electrodes of the amorphous wire and is generated as a detected voltage.

4. The MI magnetic field sensor according to claim 1, wherein
the MI magnetic field sensor is configured such that a magnetic field signal in response to the external magnetic field intensity around the amorphous wire is detected based on an alternating current voltage induced between two electrodes of a detecting coil wound around the amorphous wire and is generated as a detected voltage.

5. The MI magnetic field sensor according to claim 2, wherein
the MI magnetic field sensor is configured such that a magnetic field signal in response to the external magnetic field intensity around the amorphous wire is detected based on an alternating current voltage induced between two electrodes of the amorphous wire and is generated as a detected voltage.

6. The MI magnetic field sensor according to claim 2, wherein
the MI magnetic field sensor is configured such that a magnetic field signal in response to the external magnetic field intensity around the amorphous wire is detected based on an alternating current voltage induced between two electrodes of a detecting coil wound around the amorphous wire and is generated as a detected voltage.

* * * * *